United States Patent
Yu

[19]

[11] Patent Number: 5,904,559
[45] Date of Patent: May 18, 1999

[54] THREE DIMENSIONAL CONTACT OR VIA STRUCTURE WITH MULTIPLE SIDEWALL CONTACTS

[75] Inventor: Chen-Hua Douglas Yu, Keelung, Taiwan

[73] Assignee: Taiwan Semiconductor Manufacturing Company, Ltd., Hsin-Chu, Taiwan

[21] Appl. No.: 08/967,916

[22] Filed: Nov. 12, 1997

Related U.S. Application Data

[63] Continuation of application No. 08/612,621, Mar. 6, 1996.

[51] Int. Cl.$^6$ .......................... H01L 21/31; H01L 21/768
[52] U.S. Cl. .......................... 438/638; 438/625; 438/627; 438/633
[58] Field of Search ................................ 438/625, 626, 438/627, 633, 631, 637, 638, 639

[56] References Cited

U.S. PATENT DOCUMENTS

| | | | |
|---|---|---|---|
| 5,288,665 | 2/1994 | Nulman | 437/194 |
| 5,350,712 | 9/1994 | Shibata | 437/195 |
| 5,387,550 | 2/1995 | Cheffings et al. | 437/189 |
| 5,407,861 | 4/1995 | Marangon et al. | 437/192 |
| 5,496,773 | 3/1996 | Rhodes et al. | 437/203 |
| 5,561,327 | 10/1996 | Jun | 257/775 |
| 5,591,673 | 1/1997 | Chao et al. | 437/192 |
| 5,710,078 | 1/1998 | Tseng | 438/620 |
| 5,801,099 | 9/1998 | Kim et al. | 438/666 |

FOREIGN PATENT DOCUMENTS 534631  3/1993  European Pat. Off. .

OTHER PUBLICATIONS

S. Wolf, Silicon Processing for the VLSI Era, vol. 2, Lattice Press, pp. 132, 246–249, 1990.

*Primary Examiner*—John F. Niebling
*Assistant Examiner*—Ha Tran Nguyen
*Attorney, Agent, or Firm*—George O. Saile; Stephen B. Ackerman

[57] ABSTRACT

A process has been developed in which the contact area, between an overlying metal filled via structure, and an underlying metal interconnect structure, has been increased. The process features opening a via hole, in a dielectric layer, to an underlying metal interconnect structure, with the via hole being larger in width then the width of the underlying metal interconnect structure. Continued selective removal of the dielectric layer, in the via hole, results in exposure of the sides of the metal interconnect structure. Subsequent formation of an overlying metal filled via structure, in the via hole, results in an increase in contact area between the overlying metal filled via structure, and the narrow, metal interconnect structure.

25 Claims, 3 Drawing Sheets

THREE DIMENSIONAL CONTACT OR VIA STRUCTURE WITH MULTIPLE SIDEWALL CONTACTS

This is a continuation of Ser. No. 08/612,621, filed Mar. 6, 1996.

BACKGROUND OF THE INVENTION (1) Field of the Invention

The present invention relates to methods used to fabricate semiconductor devices, and more specifically to processes used to improve the electrical contact between metal filled vias and metal interconnect structures.

(2) Description of Prior Art

The semiconductor industry is continually striving to improve the performance of silicon devices and circuits, while still attempting to maintain, or decrease the manufacturing cost of silicon chips, comprised of these higher performing silicon devices and circuits. Micro-miniaturazation, or the ability of the semiconductor industry to create silicon devices with sub-micron features, has allowed the performance, as well as the cost, objectives to be met. Sub-micron device features result in performance improvements via decreases in parasitic capacitances, and resistances. In addition smaller device features allow the silicon chip size to be reduced, resulting in a greater number of silicon chips to be realized from a specific size substrate, thus reducing the manufacturing cost of a specific chip. The attainment of micro-miniaturazation has been highlighted by advances in specific semiconductor fabrication disciplines, such as photolithography, as well as reactive ion etching. The development of more sophisticated exposure cameras, as well as the use of more sensitive photoresist materials, have allowed sub-micron images in photoresist layers to be routinely achieved. In addition, advances in dry etching, or reactive ion etching, (RIE), have allowed the sub-micron images in photoresist layers to be successfully transferred to underlying materials, used for the fabrication of advanced silicon devices.

The use of sub-micron features, although allowing the performance and cost objectives of the semiconductor industry to be realized, does present specific fabrication problems, not encountered for the fabrication of silicon devices using less aggressive designs. For example conventional approaches restrict the size of a contact or via, so that it comfortably falls on an underlying metal structure. This fully landed contact, or via, is usually made smaller than the width of the underlying metal structure by the amount of photolithographic misalignment allowed in the process. To take advantage of the micro-miniaturazation breakthroughs, these contacts or vias are now created with sub-micron dimensions. This brings about the problem of filling sub-micron vias with metal. The use of chemically vapor deposited tungsten, to fill sub-micron vias, is being used for via fills, taking advantage of the ability of tungsten to sustain high current densities without risking electromigration failure. However the mechanism of filling narrow diameter holes with CVD metals, results in a seam or void, at the center of the metal fill. This seam or void, when subjected to subsequent process steps, such as dry etching, used to form a metal plug in the narrow diameter hole, can evolve into a defect that can result in topology problems for subsequent overlying metallization structures. Many solutions for the metal seam phenomena have been described. For example Cheffings, et al, in U.S. Pat. No. 5,387,550, describe a process for filling voids or seams, in tungsten filled contact holes, with silicon. Marangon, et al, in U.S. Pat. No. 5,407,861, describe a process for minimizing the seam, by using a novel etch back process, to create the tungsten plug, without subjecting the exposed seam to additional dry etching procedures.

The process described in this invention will use a different approach. This invention will show a method of maintaining packing densities by reducing the size of the underlying metal structure, while increasing the size of the overlying metal filled via. The amount of contact area between the overlying metal filled via, and the underlying metal structure, is increased by removal of some passivation insulator from the sides of the underlying metal structure, making these exposed sides available for contact from the subsequent overlying, metal filled via. This approach, of using wider metal filled vias, reduce the seam problem, encountered with narrower via counterparts.

SUMMARY OF THE INVENTION

It is an object of this invention to fabricate silicon devices comprised of metal filled contact or vias, larger in width then the width of underlying interconnect metallization structure.

It is another object of this invention to open a contact or via, in a dielectric layer, that has been planarized via chemical-mechanical polishing procedures.

It is still another object of this invention to open a contact or via, in a dielectric layer, to expose the top surface of the underlying interconnect metallization structure.

It is yet another object of this invention to increase the contact area, between a subsequent metal filled via, and an underlying interconnect metallization structure, by continuing to remove dielectric layer material, and exposing a top portion of sides of the interconnect metallization structure.

It is still yet another object of this invention to fill the opened contact or via, with metal, contacting the top surface, as well as the sides of the underlying interconnect metallization structure.

In accordance with the present invention a method is described for fabricating a metal filled contact or via, larger in width then the width of an underlying interconnect metallization structure, and contacting the top surface, as well as the sides of the underlying interconnect metallization structure. A first dielectric layer is deposited on an underlying silicon device structure, followed by the opening of contact holes to active device regions of the underlying silicon device structure. A first metal layer is deposited, completely filling the opened contact holes, and patterned to form a first level interconnect metallization structure. A second dielectric layer is deposited on the first level interconnect metallization structure, as well as on the regions of underlying first dielectric layer, not covered by the first level interconnect metallization structure. A chemical-mechanical polishing procedure is performed to planarize the second dielectric layer. Photolithographic and dry etching procedures are next employed to open a hole in the second dielectric layer, to expose the top surface of the underlying first level interconnect metallization structure, with the opening in the second dielectric layer, larger in width then the width of the first level interconnect metallization structure. The dry etching procedure is then continued to remove additional second dielectric layer material, recessing the opened hole, to expose the top part of the sides of the first level interconnect metallization structure. After photoresist removal, a thin barrier layer, followed by a second metal layer, is deposited, completely filling the recessed opened hole, and contacting the top surface, as well as the exposed sides of the first level interconnect metallization structure. The unwanted areas of the second metal layer, and the thin barrier layer, are next removed to create a metal filled contact or via, larger in width than the width of the underlying first level interconnect metallization structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
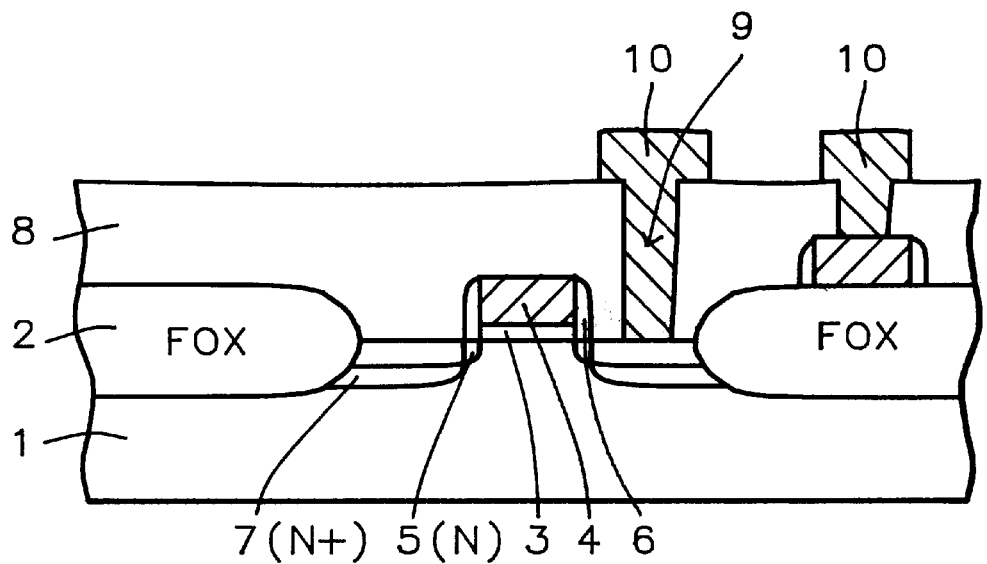
FIG. 1, which schematically shows a typical N channel, (NFET), device, with a first level interconnect metallization structure.

The method for creating metal filled vias, larger in width then the width of an underlying interconnect metallization structure, and contacting the top surface, as well as a top portion of the sides of the underlying interconnect metallization structure, will now be covered in detail. This invention can be used as part of metal oxide semiconductor field effect transistor, (MOSFET), devices, that are now being manufactured in industry, therefore only the specific areas unique to understanding this invention will be covered in detail. FIG. 1, schematically shows a an N channel, (NFET), structure, that this invention will be applied to. A starting, P type substrate, 1, consisting of single crystalline silicon, having a <100> crystallographic orientation, is used. Thick field oxide regions, 2, (FOX), are formed for isolation purposes. The FOX regions are formed by initially creating an composite insulator oxidation mask, composed of an overlying silicon nitride layer and an underlying silicon dioxide layer. After patterning the composite insulator oxidation mask, to create the desired device region shape, followed by photoresist removal, a thermal oxidation is performed in the unmasked regions to grow between about 4000 to 6000 Angstroms of a FOX, 2, silicon dioxide region. After removal of the composite insulator oxidation mask, exposing the subsequent NFET device region, a thin gate insulator layer, 3, of silicon dioxide, is thermally grown to a thickness between about 50 to 300 Angstroms. A layer of polysilicon is next deposited using low pressure chemical vapor deposition, (LPCVD), procedures, to a thickness between about 2000 to 4000 Angstroms. The polysilicon layer is doped via an ion implantation of either phosphorous or arsenic, at an energy between about 50 to 100 Kev., at a dose between about 1E15 to 1E16 atoms/cm$^2$. Standard photolithographic and reactive ion etching, (RIE), procedures, using $Cl_2$ as an etchant, are used to produce polysilicon gate structure, 4, shown schematically in FIG. 1.

After photoresist removal, via plasma oxygen ashing, followed by careful wet cleans, a lightly doped, N type, source and drain region, 5, is created via an ion implantation of phosphorous, at an energy between about 30 to 60 Kev., at a dose between about 1E12 to 5E13 atoms/cm$^2$. A silicon oxide layer is next deposited using either LPCVD or plasma enhanced chemical vapor deposition, (PECVD), processing, to a thickness between about 1500 to 4000 Angstroms, using tetraethylorthosilicate as a source. An anisotropic, RIE procedure, using $CHF_3$ as an etchant, is then employed to create insulator sidewall spacer, 6. A heavily doped, N type, source and drain region, 7, is next formed, again via an ion implantation procedure, now via use of arsenic, at an energy between about 50 to 100 Kev., at a dose between about 1E14 to 5E15 atoms/cm$^2$. Another silicon oxide layer, 8, is again deposited using either LPCVD or PECVD processing, at a temperature between about 400 to 800° C., to a thickness between about 3000 to 6000 Angstroms. Conventional photolithographic and RIE procedures, using $CHF_3$ as an etchant, are used to open contact hole, 9, to source and drain region, 7, as well as to polysilicon gate structure, 4. The opening of contact hole, 9, is between about 0.1 to 1.0 uM, in diameter. After photoresist removal, via plasma oxygen ashing and careful wet cleans, a metallization layer of aluminum, containing between about 1 to 3 weight % copper, and between about 0.5 to 1.0 weight % silicon, is deposited, using r.f. sputtering, to a thickness between about 4000 to 8000 Angstroms, completely filling contact hole, 9. An alternative is to use a metallization layer of tungsten, deposited via LPCVD procedures, at a temperature between about 400 to 600° C., again to a thickness between about 4000 to 8000, using tungsten hexafluoride as a source, and again completely filling contact hole, 9.

Patterning of the metallization layer is performed using conventional photolithographic and RIE procedures, using $Cl_2$ as an etchant, to produce metal structure, 10, shown schematically in FIG. 1, after photoresist removal, accomplished using plasma oxygen ashing and careful wet cleans. The width of the metal structure, 10, is between about 0.15 to 1.2 uM. The narrow metal lines are intentionally created to shrink the metal line—space periodicity, which is easier to accomplish then decreasing the subsequent, overlying metal filled via—space periodicity.

Figure 2:
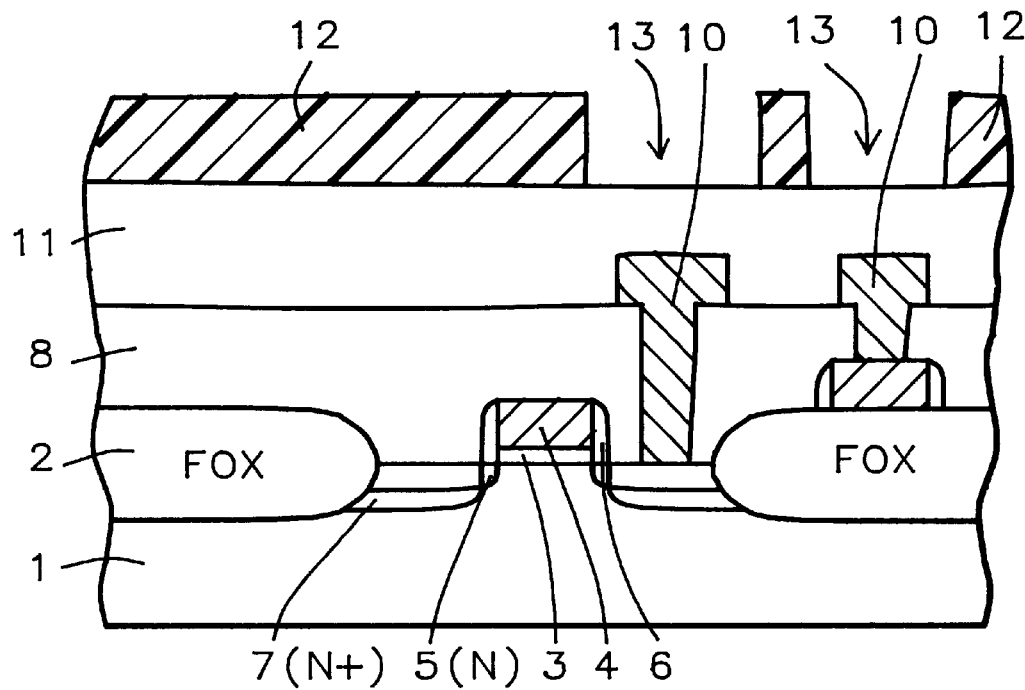
FIGS. 2–3, which schematically show the creation of a via hole, in a planarized dielectric layer, to the underlying first level interconnect metallization structure.
Figure 3:
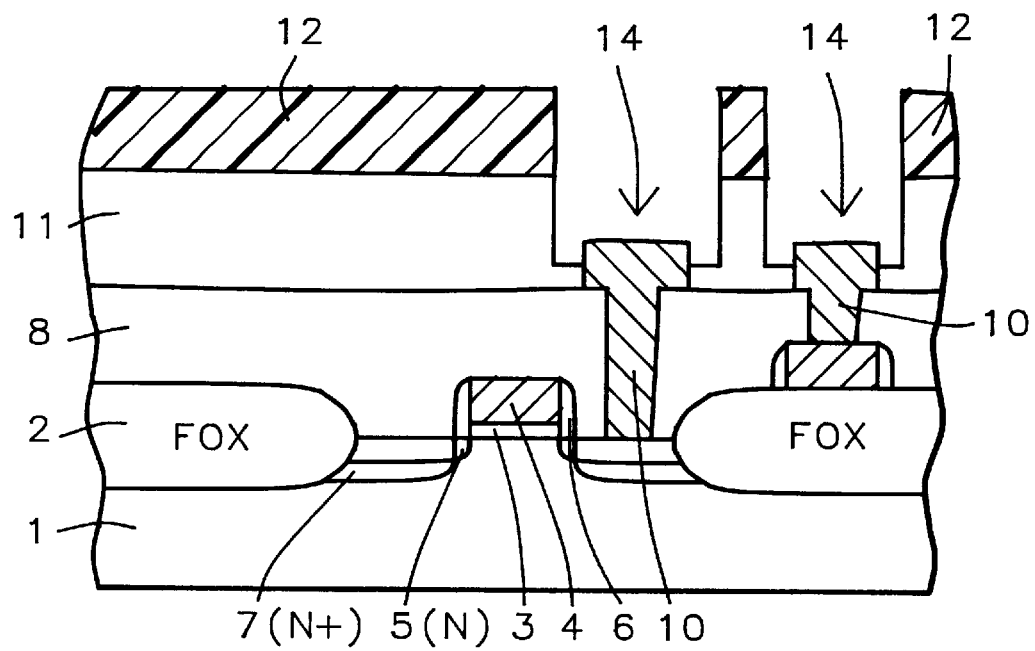

A deposition of a silicon oxide layer, 11, is next performed, using PECVD processing, at a temperature between about 400 to 600° C., to a thickness between 3000 to 10000 Angstroms. A chemical mechanical polishing procedure is then used to planarize silicon oxide layer, 11, for purposes of optimizing subsequent via hole formation, in silicon oxide layer, 11. Photoresist layer, 12, is then applied and exposed to open regions, 13, in photoresist layer, 12, shown schematically in FIG. 2. Opening, 13, is formed, directly overlying metal structure, 10, to a width between about 0.2 to 1.3 uM, intentionally larger then the width of underlying metal structure, 10. A RIE procedure, using $CHF_3$ is then performed, using opening, 13, in photoresist layer, 12, to create opening, 14, in silicon oxide layer, 11. The RIE procedure is performed to initially remove all of insulator layer, 11, from the top surface of metal structure, 10. Then the dry etching process is continued to remove between about 1000 to 5000 Angstroms of additional silicon oxide layer, 11, recessing opening 14, below the top surface of metal structure, 10, and thus exposing a portion of the sides of metal structure, 10. This is schematically shown in FIG. 3. Photoresist removal is again accomplished using plasma oxygen ashing and careful wet cleans.

Figure 4:
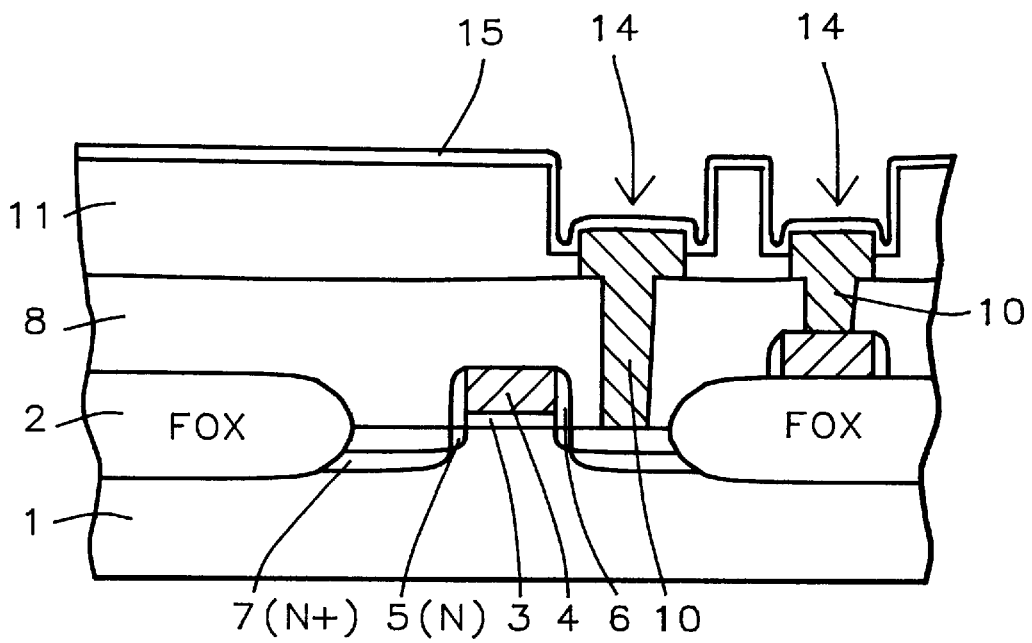
FIGS. 4–5, which schematically show the stages of processing used to metal fill the via hole, and form the desired metal plug, larger in width then the width of the underlying first level interconnect metallization structure.
Figure 5:
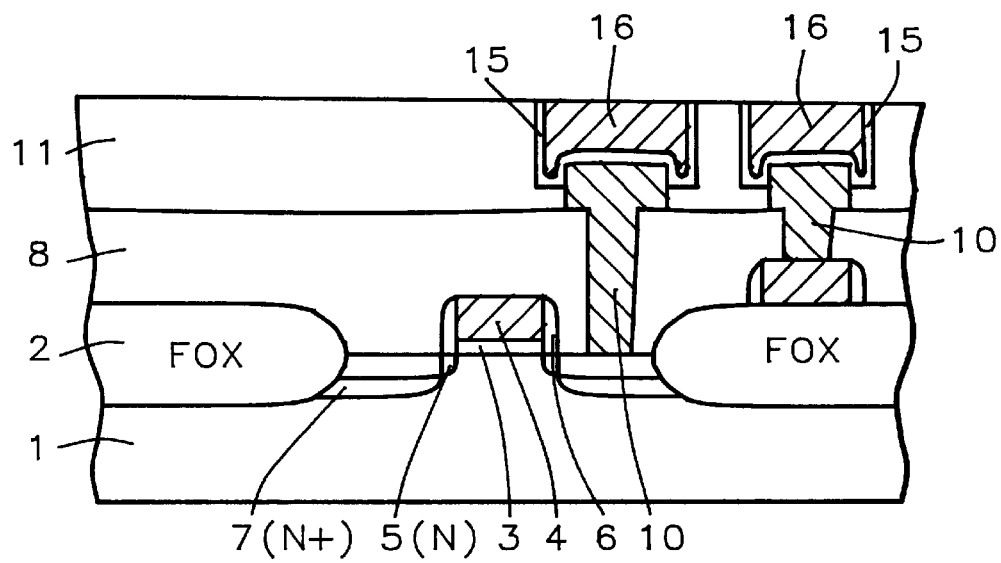

A layer of titanium nitride, 15, with an optional underlying layer of titanium, not shown, is illustrated schematically in FIG. 4. The titanium nitride layer, 15, is deposited using r.f. sputtering, or via use of chemical vapor deposition processes, to a thickness between about 50 to 1000 Angstroms, and is used for barrier, as well as for electromigration resistance enhancements. Another metallization layer of aluminum, containing between about 1 to 3% copper, and between about 0.5 to 1.0% silicon, is deposited, using r.f. sputtering, to a thickness between about 4000 to 8000 Angstroms, completely filling opening, 14. Again an alternative is to use a metallization layer of tungsten, deposited via LPCVD processes, at a temperature between about 300 to 600° C., to a thickness between about 4000 to 8000 Angstroms. The removal of unwanted metal, aluminum or tungsten, as well as titanium nitride, is accomplished via either a selective, RIE procedure, using $Cl_2$ as an etchant, or via use of a chemical mechanical polishing procedure, selectively stopping at the top surface of silicon oxide layer, 11. This procedure results in the formation of metal plug, 16, filling opening, 14, and contacting the top surface, as well as a portion of the exposed sides of underlying metal structure, 10. This is described schematically in FIG. 5. The creation of a metal filled via, or metal plug, larger in width then the underlying metal structure, reduces the stringent photolithographic alignment requirements, experienced when using small vias, on larger underlying metal structures. In addition this process allows the insulator layer, surrounding the underlying metal structure, to be recessed, exposing additional contact surfaces, thus reducing contact or interface resistances, and enhancing performance.

This process, although shown as an application to NFET device structures, can benefit applications for P channel, (PFET), device structures, complimentary, (CMOS), device structures, as well as benefitting BiCMOS designs.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device structure, on a semiconductor substrate, in which the contact area is increased, between a wider, overlying metal filled via, and a narrower, underlying, metal interconnect structure, comprising the steps of:

providing elements of said MOSFET device structure, on said semiconductor structure;

depositing a first insulator layer on said elements of said MOSFET device structure;

opening a contact hole in said first insulator layer, to said elements, of said MOSFET device structure;

depositing a first metallization layer on top surface of first insulator layer, and completely filling said contact hole;

patterning of said first metallization layer, to form contact plug, in said contact hole, and forming a first metal interconnect structure, on top surface of said first insulator layer, and overlying said contact hole, with said first metal interconnect structure extending between about 4000 to 8000 Angstroms, above the top surface of said first insulator layer;

deposition of a second insulator layer on said first metal interconnect structure, and on top surface of said first insulator layer, not covered by said first metal interconnect structure;

planarization of said second insulator layer;

forming a photoresist shape on the top surface of the planarized second insulator layer, with an opening in said photoresist shape, exposing a region of the planarized second insulator layer, directly overlying the top surface of said first metal interconnect structure, and with the width of said opening, in said photoresist shape, larger than the width of the top surface of said first metal interconnect structure;

opening a via hole in a first portion of said second insulator layer, to expose the top surface of said first metal interconnect structure, with said via hole larger in width than the width of underlying said first metal interconnect structure;

recessing of said second insulator layer, in said opened via hole, to a depth between about 1000 to 5000 Angstroms, to expose between about 1000 to 5000 Angstroms, of the sides of said first metal interconnect structure, with the recess extending only into a second portion of said second insulator layer, and not exposing any portion of said first insulator layer;

removal of said photoresist shape;

deposition of a barrier layer on top surface of said second insulator layer, on exposed surfaces of said first metal interconnect structure, in said opened via hole, and on the exposed surfaces of said first metal interconnect structure, exposed in said recess in said second insulator layer, and on surfaces of said second insulator layer exposed in said opened via hole, and exposed in said recess in said second insulator layer;

deposition of a second metallization layer on said barrier layer, completely filling said opened via hole, and completely filling said recess in said second insulator layer; and removal of said second metallization layer, and said barrier layer, from top surface of said second insulator layer, to form a metal filled via structure in said opened via hole, and in said recess in said second insulator layer, in which said metal filled via structure contacts the portion of said barrier layer, located on the top surface, as well as said portions of the sides, of underlying said first metal interconnect structure.

2. The method of claim 1, wherein said first metallization layer is aluminum, containing copper and silicon, deposited using r.f. sputtering to a thickness between about 4000 to 8000 Angstroms.

3. The method of claim 1, wherein said first metallization layer is tungsten, deposited using LPCVD processing, at a temperature between about 300 to 600° C., to a thickness between about 4000 to 8000 Angstroms, using tungsten hexafluoride as a source.

4. The method of claim 1, wherein said first metal interconnect structure is formed via anisotropic RIE processing, using $Cl_2$ as an etchant, with said first metal interconnect structure having a width between about 0.15 to 1.2 uM.

5. The method of claim 1, wherein said second insulator layer is silicon oxide, deposited using PECVD processing, at a temperature between about 300 to 600° C., to a thickness between about 3000 to 10000 Angstroms.

6. The method of claim 1, wherein said second insulator layer is planarized using chemical mechanical polishing procedures.

7. The method of claim 1, wherein said opened via hole, is opened to expose top surface of said first metal interconnect structure, using RIE processing, and using $CHF_3$ as an etchant, with said opened via hole having a width between about 0.20 to 1.3 uM.

8. The method of claim 1, wherein recessing of said second insulator layer, in said opened via hole, is performed using RIE processing, using $CHF_3$ as an etchant, with between about 4000 to 15000 Angstroms of said second insulator layer being removed from said opened via hole.

9. The method of claim 1, wherein said barrier layer is titanium nitride, deposited using r.f. sputtering, or chemical vapor deposition processes, to a thickness between about 50 to 1000 Angstroms.

10. The method of claim 1, wherein said second metallization layer is aluminum, containing copper and silicon, deposited using r.f. sputtering, to a thickness between about 4000 to 8000 Angstroms.

11. The method of claim 1, wherein said second metallization layer is tungsten, deposited using LPCVD processing, at a temperature between about 300 to 600° C., to a thickness between about 4000 to 8000 Angstroms, using tungsten hexafluoride as a source.

12. The method of claim 1, wherein said metal filled via structure is formed in said opened via hole, via use of chemical mechanical polishing procedures, removing unwanted layers of said second metallization layer, and of said barrier layer, from top surface of said second insulator layer.

13. The method of claim 1, wherein said metal filed via structure is formed in said opened via hole, using RIE procedures, with $Cl_2$ used as the etchant, removing unwanted layers of said second metallization layer, and of said barrier layer, from the top surface of said second insulator layer.

14. A method for fabricating a MOSFET device structure, on a semiconductor substrate, in which the contact area is increased, by removal of insulator from the sides of an underlying, narrow, metal interconnect structure, in a via hole, and forming a metal filled via hole, larger in width than said narrow, underlying metal interconnect structure, thus contacting the top surface, as well as regions of exposed sides of the underlying, said narrow, metal interconnect structure, comprising the steps of:

providing elements of said MOSFET device structure, on said semiconductor substrate;

depositing a first insulator layer on said elements of said MOSFET device structure;

opening a contact hole, in said first insulator layer, to said elements, of said MOSFET device structure;

depositing a first metallization layer on top surface of said first insulator layer, and completely filling said contact hole;

patterning of said first metallization layer to form a contact plug, in said contact hole, and forming a narrow, first metal interconnect structure, on top surface of said first insulator layer, overlying said contact plug, with said first metal interconnect structure, extending between about 4000 to 8000 Angstroms, above the top surface of said first insulator layer;

deposition of a second insulator layer on said narrow, first metal interconnect structure, and on top surface of said first insulator layer, not covered by said narrow, first metal interconnect structure;

chemical mechanical polishing of said second insulator layer to create planarized second insulator layer;

forming a photoresist shape on said planarized second insulator layer, with an opening in said photoresist shape, exposing a region of said planarized second insulator layer, directly overlying the top surface of said narrow, first metal interconnect structure, and with said opening in said photoresist shape larger in width than the width of the top surface of said narrow, first metal interconnect structure;

opening a via hole in a first portion of said planarized second insulator layer, to the top surface of said narrow, first metal interconnect structure, with said opened via hole, larger in width than width of said narrow, first metal interconnect structure;

recessing of said planarized second insulator layer, in said opened via hole, to a depth between about 1000 to 5000 Angstroms to expose between about 1000 to 5000 Angstroms, of the sides of said narrow, first metal interconnect structure, with the recess only extending into a second portion of said second insulator layer, not exposing any portion of said first insulator layer;

removal of said photoresist shape;

deposition of a titanium nitride barrier layer on top surface, and exposed sides, of said narrow, first metal interconnect structure, and on surfaces of said planarized second insulator layer, in said opened via hole, and in said recess in said second insulator layer, as well as on top surface of said planarized second insulator layer;

deposition of a second metallization layer on said titanium nitride barrier layer, completely filling said opened via hole, and said recess in said second insulator layer; and removal of said second metallization layer, and said titanium nitride barrier layer, from top surface of said planarized second insulator layer, forming a metal filled via structure, in said opened via hole, and in said recess in said second insulator layer, in which said metal filled via structure is wider than underlying, said narrow, first metal interconnect structure, resulting in said metal filled via structure contacting the top surface, as well as the exposed sides of said narrow, first metal interconnect structure.

15. The method of claim 14, wherein said first metallization layer is aluminum, containing copper and silicon, deposited using r.f. sputtering, to a thickness between about 4000 to 8000 Angstroms.

16. The method of claim 14, wherein said first metallization layer is tungsten, deposited via LPCVD processing, at a temperature between about 300 to 600° C., to a thickness between about 4000 to 8000 Angstroms, using tungsten hexafluoride as a source.

17. The method of claim 14, wherein said narrow, first metal interconnect structure is formed via RIE processing, using $Cl_2$ as an etchant, with said narrow, first metal interconnect structure having a width between about 0.15 to 1.2 uM.

18. The method of claim 14, wherein said second insulator layer is silicon oxide, deposited using PECVD processing, at a temperature between about 300 to 600° C., to a thickness between about 3000 to 10000 Angstroms.

19. The method of claim 14, wherein said opened via hole is opened to expose top surface of said narrow, first metal interconnect structure, using RIE processing, with the use of $CHF_3$ as an etchant, with said opened via hole having a width between about 0.20 to 1.3 uM.

20. The method of claim 14, wherein said second metallization layer is aluminum, containing copper and silicon, deposited using r.f. sputtering, to a thickness between about 4000 to 8000 Angstroms.

21. The method of claim 14, wherein said titanium nitride barrier layer is deposited using r.f. sputtering, to a thickness between about 50 to 1000 Angstroms.

22. The method of claim 14, wherein said second metallization layer is aluminum, containing between about 1 to 3 weight % copper, and between about 0.5 to 1.0 weight % silicon, deposited using r.f. sputtering, to a thickness between about 4000 to 8000 Angstroms.

23. The method of claim 14, wherein said second metallization layer is tungsten, deposited using LPCVD processing, at a temperature between about 300 to 600° C., to a thickness between about 4000 to 8000 Angstroms, using tungsten hexafluoride as a source.

24. The method of claim 14, wherein said metal filled via structure, is formed in said opened via hole, using chemical mechanical polishing procedures, removing unwanted layers of said second metallization layer, and of said titanium nitride barrier layer, from top surface of said planarized second insulator layer.

25. The method of claim 14, wherein said metal filled via structure, is formed in said opened via hole, using RIE procedures with $Cl_2$ used as the etchant, removing unwanted layers of said second metallization layer, and of said titanium nitride barrier layer, from top surface of said planarized second insulator layer.

* * * * *